(12) United States Patent
Xiao et al.

(10) Patent No.: US 7,696,551 B2
(45) Date of Patent: Apr. 13, 2010

(54) COMPOSITE HARD MASK FOR THE ETCHING OF NANOMETER SIZE MAGNETIC MULTILAYER BASED DEVICE

(75) Inventors: Rongfu Xiao, Fremont, CA (US); Chyu-Jiuh Torng, Pleasanton, CA (US); Tom Zhang, Saratoga, CA (US); Witold Kula, Cupertino, CA (US); Adam Zhang, Milpitas, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 386 days.

(21) Appl. No.: 11/901,999

(22) Filed: Sep. 20, 2007

(65) Prior Publication Data

US 2009/0078927 A1    Mar. 26, 2009

(51) Int. Cl.
*H01L 21/00* (2006.01)
(52) U.S. Cl. .............................. 257/295; 257/421; 438/3
(58) Field of Classification Search ................. 257/295, 257/421; 438/3
See application file for complete search history.

(56) References Cited

U.S. PATENT DOCUMENTS

| | | |
|---|---|---|
| 6,984,529 B2 | 1/2006 | Stojakovic et al. |
| 7,001,783 B2 | 2/2006 | Costrini et al. |
| 7,060,194 B2 | 6/2006 | Kodaira et al. |
| 7,252,774 B2 | 8/2007 | O'Sullivan et al. |

OTHER PUBLICATIONS

Co-pending U.S. Patent, filed Sep. 28, 2006 U.S. Appl. No. 11/528,877, Bottom Electrode for MRAM.
Device and Method to Fabricate It, assigned to the same assignee as the present invention.
"Current-driven excitation of magnetic multilayers", by J.C. Slonczewski, Jrnl. of Magnetism and Magnetic.
Materials, Copyright 1996, Elsevier Science B.V. 0304-8853/96, pp. L1-L7.
"Emission of spin waves by a magnetic multilayer traversed by a current", by L. Berger, Physical Review B, vol. 54, No. 13, Oct/ 1, 1996-I, pp. 9353-9358.
Co-pending U.S. Patent, U.S. Appl. No. 11/975,045, filed Oct. 17, 2007, Method of Magnetic Tunneling Layer.
Processes for Spin-Transfer Torquemram, assigned to the same assignees as the present invention.

*Primary Examiner*—Douglas M Menz
(74) *Attorney, Agent, or Firm*—Saile Ackerman LLC; Stephen B. Ackerman

(57) ABSTRACT

A composite hard mask is disclosed that enables sub-100 nm sized MTJ cells to be formed for advanced devices such as spin torque MRAMs. The hard mask has a lower non-magnetic metallic layer such as Ru to magnetically isolate an overlying middle metallic spacer such as MnPt from an underlying free layer. The middle metallic spacer provides a height margin during subsequent processing to avoid shorting between a bit line and the MTJ cell in the final device. An upper conductive layer may be made of Ta and is thin enough to allow a MTJ pattern in a thin overlying photoresist layer to be transferred through the Ta during a fluorocarbon etch without consuming all of the photoresist. The MTJ pattern is transferred through the remaining hard mask layers and underlying MTJ stack of layers with a second etch step using a C, H, and O etch gas composition.

21 Claims, 7 Drawing Sheets

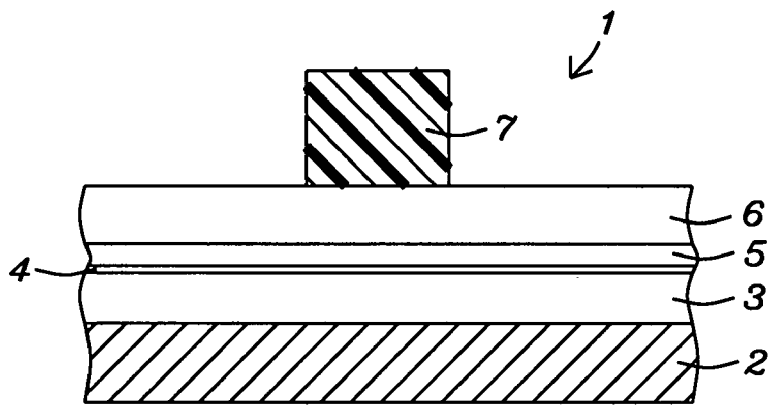
FIG. 1a — Prior Art
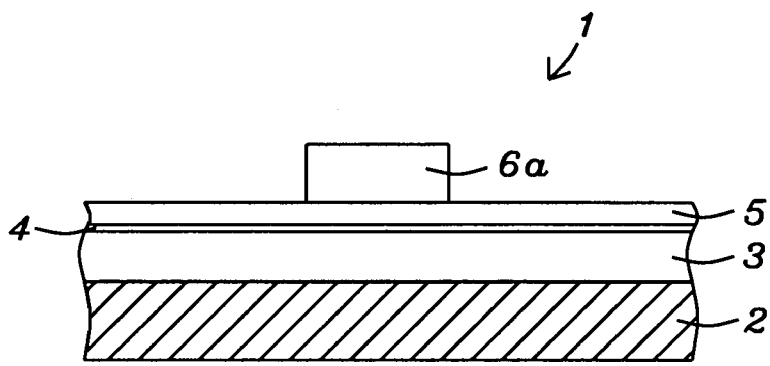
FIG. 1b — Prior Art
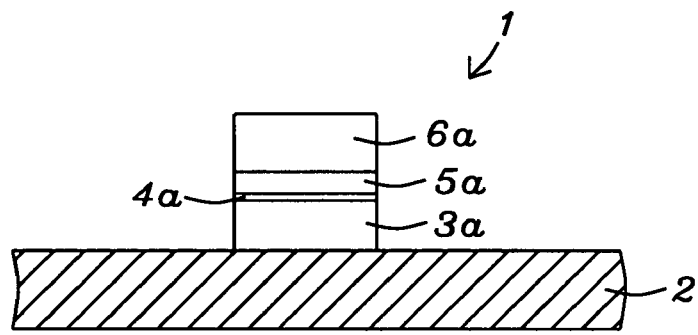
FIG. 1c — Prior Art

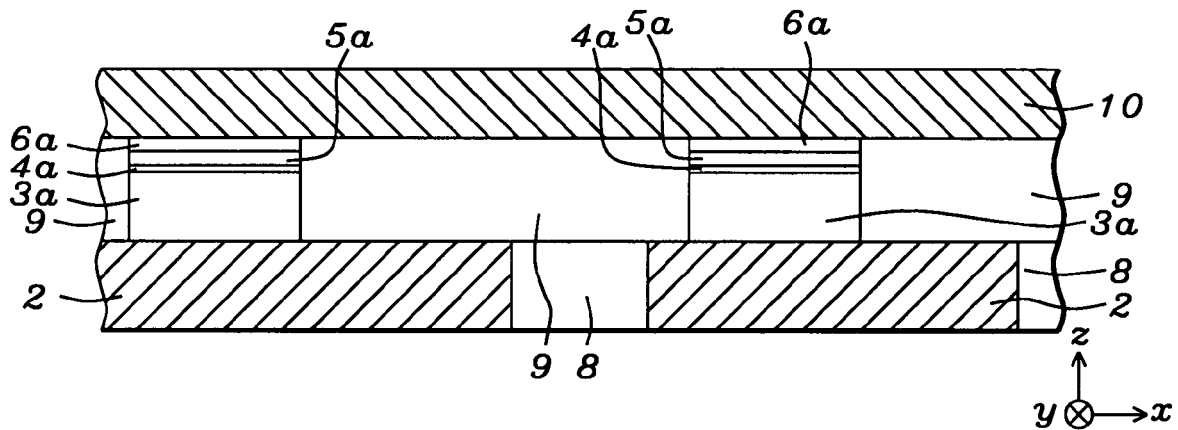
FIG. 1d – Prior Art
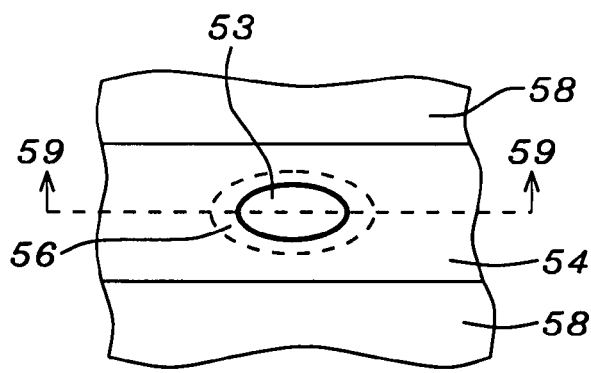
FIG. 2a – Prior Art
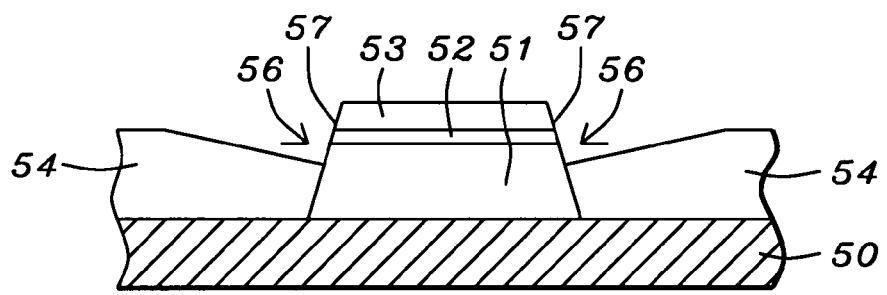
FIG. 2b – Prior Art

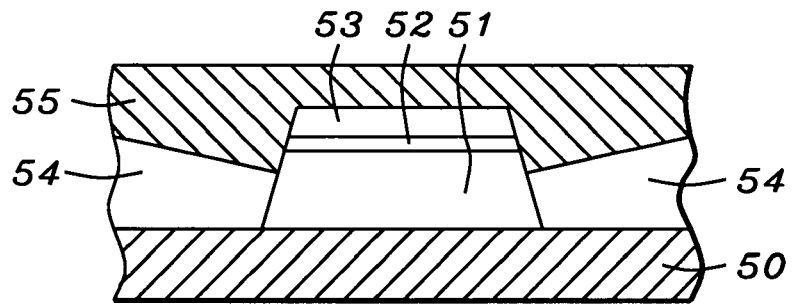
FIG. 2c - Prior Art
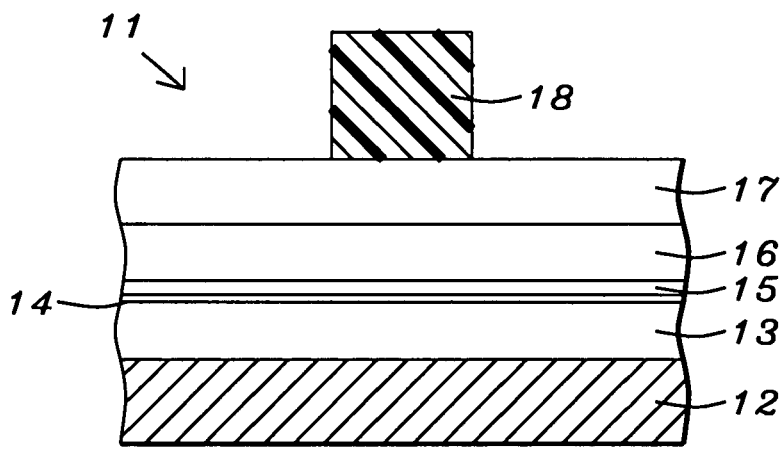
FIG. 3a - Prior Art
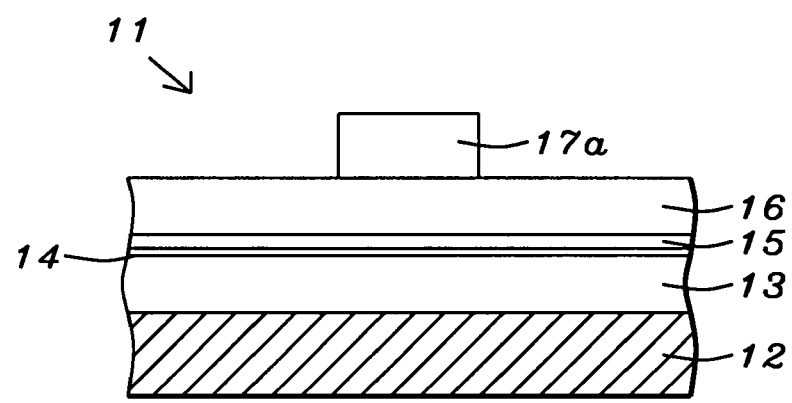
FIG. 3b - Prior Art

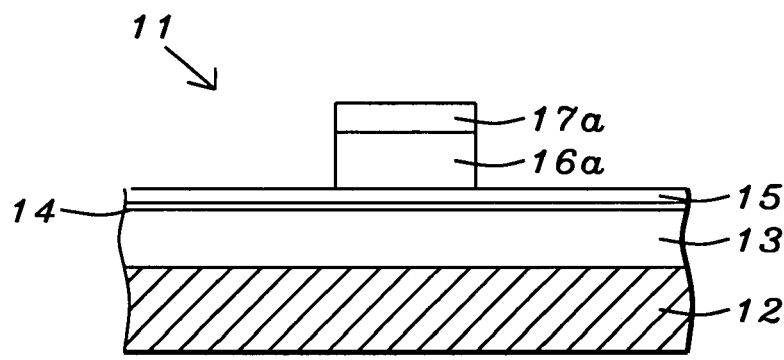
FIG. 3c - Prior Art
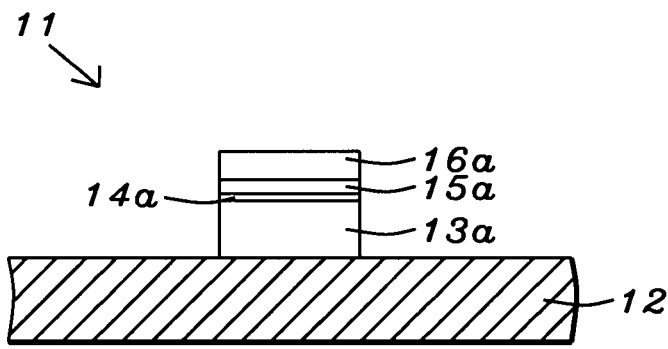
FIG. 3d - Prior Art
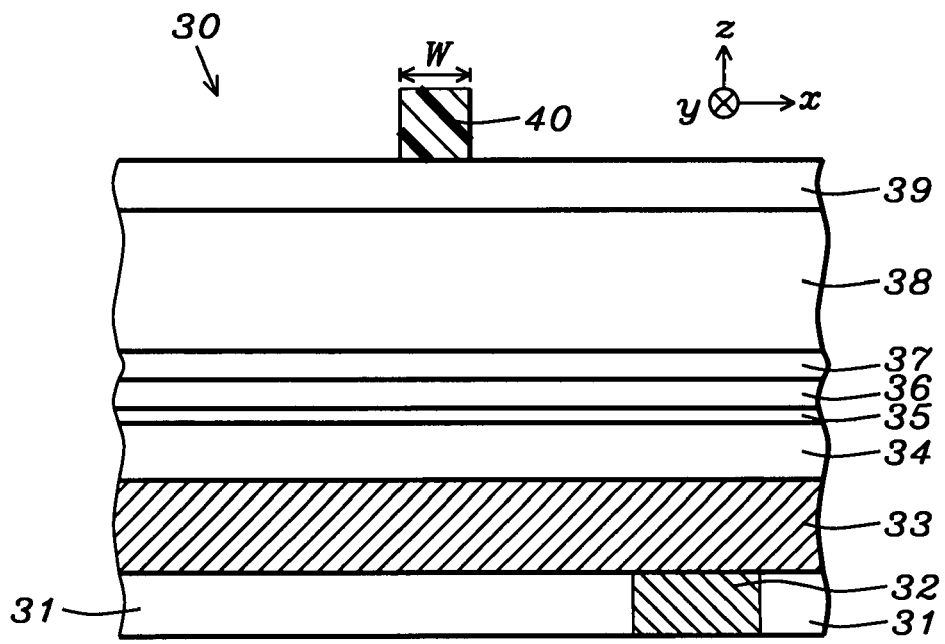
FIG. 4a

COMPOSITE HARD MASK FOR THE ETCHING OF NANOMETER SIZE MAGNETIC MULTILAYER BASED DEVICE

RELATED PATENT APPLICATION

This application is related to the following: Ser. No. 11/528,877, filing date Sep. 28, 2006; and Ser. No. 11/975,045, filing date Oct. 17, 2007, both assigned to a common assignee and herein incorporated by reference in their entirety.

FIELD OF THE INVENTION

The invention relates to a composite hard mask that facilitates the formation of a MTJ element and an etch sequence involving the hard mask that enables sub-100 nm sized MTJs to be formed with sufficient process window latitude for manufacturing and with sufficient height margin to allow a subsequent chemical mechanical polish (CMP) step to proceed with acceptable yield.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, Flash, etc. A MRAM device is generally comprised of an array of parallel first conductive lines on a horizontal plane, an array of parallel second conductive lines on a second horizontal plane spaced above and formed in a direction perpendicular to the first conductive lines, and an MTJ element interposed between a first conductive line and a second conductive line at each crossover location. A first conductive line may be a word line while a second conductive line is a bit line or vice versa. Alternatively, a first conductive line may be a bottom electrode that is a sectioned line while a second conductive line is a bit line (or word line). There are typically other devices including transistors and diodes below the array of first conductive lines as well as peripheral circuits used to select certain MRAM cells within the MRAM array for read or write operations.

An MTJ element may be based on a tunneling magnetoresistance (TMR) effect wherein a stack of layers has a configuration in which two ferromagnetic layers are separated by a thin non-magnetic dielectric layer. An MTJ stack of layers may be formed in a so-called bottom spin valve configuration by sequentially depositing a seed layer, an anti-ferromagnetic (AFM) pinning layer, a ferromagnetic "pinned" layer, a thin tunnel barrier layer, a ferromagnetic "free" layer, and a capping layer on a substrate.

The AFM layer holds the magnetic moment of the pinned layer in a fixed direction. The pinned layer has a magnetic moment that is fixed in the "y" direction, for example, by exchange coupling with the adjacent AFM layer. The free layer has a magnetic moment that is either parallel or anti-parallel to the magnetic moment in the pinned layer and is preferably made of NiFe because of its reproducible and reliable switching characteristics as demonstrated by a low switching field (Hc) and switching field uniformity ($\sigma$Hc). The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("1" memory state) and a higher resistance is noted when they are in an anti-parallel state or "0" memory state.

In a read operation, the information stored in a MRAM cell is read by sensing the magnetic state (resistance level) of the MTJ element through a sense current flowing top to bottom through the cell in a current perpendicular to plane (CPP) configuration. During a write operation, information is written to the MRAM cell by changing the magnetic state in the free layer to an appropriate one by generating external magnetic fields as a result of applying bit line and word line currents in two crossing conductive lines, either above or below the MTJ element. In certain MRAM architectures, the top electrode or the bottom electrode participates in both read and write operations.

Generally, the purpose of the capping layer is to protect underlying layers in the MTJ during etching and other process steps and to function as an electrical contact to an overlying conductive line. In the fabrication of MRAM devices, ion beam etching (IBE) is often used to create MTJ cell arrays. However, IBE typically produces sloped sidewalls on the MTJ cell such that the top surface (capping layer) has a smaller width than the bottom surface (seed layer). A sloped profile can not only lead to electrical shorting issues but also limits further reduction of linewidth and makes it impossible to manufacture a very high density IC device as is required for applications such as spin torque MRAM. Spin transfer (spin torque) magnetization switching is described by J. Sloneczewski in "Current-driven excitation of magnetic multilayers", J. Magn. Materials V 159, L1-L7 (1996), and by L. Berger in "Emission of spin waves by a magnetic multiplayer traversed by a current" in Phys. Rev. Lett. B, Vol. 52, p 9353. The difference between a Spin-RAM and a conventional MRAM is only in the write operation mechanism. The read mechanism is the same.

A better approach to create a well defined three dimensional micro feature is by reactive ion etch (RIE) where a chemical reaction enables easy removal of by-products formed through the interaction of gaseous reactants and the materials to be removed. In the current MRAM fabrication process, a heavy metal such as Ta is deposited on top of a MTJ stack of layers, and acts both as a hard mask for the etching of the MTJ stack and also as an interlayer conduction channel to the top bit line as described in U.S. Pat. No. 7,060,194 which is represented by the process flow in FIGS. 1a-1d. Referring to FIG. 1a, a partially formed MRAM cell 1 is shown in which a photoresist layer 7 is patterned above a Ta hard mask 6 and a MTJ stack of layers 3-5 formed on a bottom electrode 2. In FIG. 1b, the photoresist pattern is transferred through the Ta hard mask to form a hard mask feature 6a followed by removal of the photoresist layer. In FIG. 1c, the hard mask feature 6a serves as an etch mask for transferring the hard mask pattern through the underlying MTJ stack to form a MTJ cell made of layers 3a-6a. There is a certain amount of Ta thickness loss in the hard mask feature 6a that may also be considered as a capping layer in the MTJ cell. In FIG. 1d, a first insulation layer 8 is shown between adjacent bottom electrodes 2 and a second insulation layer 9 is deposited adjacent to the MTJ cell comprised of layers 3a-6a, and planarized with some further Ta thickness loss in the hard mask layer 6a before a bit line 10 is added in a subsequent step. In some cases, the thickness of hard mask layer 6a (FIG. 1d) may be too small and electrical shorting occurs between the bit line 10 and the lower layer 3a of the MTJ cell. For example, MTJ layer 3a may represent a composite comprising a seed layer, AFM layer, and pinned layer while MTJ layer 4a is a tunnel barrier, MTJ layer 5a is a free layer, and hard mask layer 6a may function as a capping layer.

For sub-micrometer sized MTJ cells, a single Ta hard mask may not be a problem. However, as the MTJ cell/pitch dimensions shrink to about 100 nm or less as required for spin torque MRAMs, the MTJ shapes generated by a RIE process may not be able to withstand subsequent CMP processing and bit line via (BLV) etching and often result in device failure due to electrical shorting between the lower portion of the MTJ cell and bit line. In the example depicted in FIG. 2a, the top surface of capping layer 53 in a conventional MTJ cell is seen from a top view and has a typical elliptical shape after a patterning and etching sequence is used to form an opening for a subsequently deposited bit line in a second insulation layer 58 above the capping layer 53. The capping layer 53 and underlying portions of the MTJ cell (not shown) are surrounded by a first insulation layer 54 that is coplanar with the capping layer except for a region adjacent to the capping layer 53 which is a depression 56. The depression 56 is formed in the first insulation layer 54 because of the preceding RIE step that etches the dielectric material in the first insulation layer 54 at a faster rate than the capping layer 53. In order to clear dielectric material from the top surface of the capping layer 53, the surrounding region of first insulation layer 54 is overetched. From a cross-sectional view in FIG. 2b taken from the plane 59-59 in FIG. 2a, sidewalls 57 along the MTJ cell are partially uncovered by the preceding RIE etch. The upper layer 53 may be a composite made of a lower free layer and upper capping layer while the middle layer 52 is a tunnel barrier and the lower layer 51 may be a composite having a seed layer/AFM/pinned layer configuration formed on a bottom electrode 50. FIG. 2c shows that after a bit line 55 is deposited to fill an opening in a second insulation layer formed on the first insulation layer, the metal in bit line 55 also fills the depression adjacent to the sidewalls 57 (FIG. 2b) and makes contact with a portion of the lower layer 51 below the tunnel barrier and thereby causes an electrical short in the device.

Fabrication of MTJ cell dimensions of about 100 nm or less requires a thin photoresist layer (<3000 Angstroms) to ensure an adequate process latitude when imaging small MTJ features on a hard mask that will later be transferred through the hard mask and a MTJ stack of layers. It is well known that an aspect ratio (thickness/width of a pattern feature) of about 3:1 or less is preferred to avoid pattern collapse during image development. However, a thin photoresist layer requires a thin Ta hard mask layer to guarantee that the hard mask pattern will be completely formed before the photoresist etch mask is consumed during the etch transfer step. Unfortunately, a thin Ta hard mask leads to potential issues of electrical shorting as mentioned previously and limits the amount of etch time available to transfer the hard mask pattern through the MTJ stack of layers because the hard mask erodes during the pattern transfer process. Thus, other alternatives besides a simple Ta hard mask are necessary when fabricating MTJ cells having an easy axis or hard axis dimension of about 100 nm or less.

One alternative described in U.S. Pat. No. 7,001,783 is a bilayer hard mask consisting of an upper dielectric layer made of $SiO_2$, silicon nitride, silicon carbide, or the like, and a lower heavy metal layer (Ta) that contacts the free layer in the MTJ stack of layers. The MTJ fabrication sequence is represented in FIGS. 3a-3d. In FIG. 3a, a partially formed MRAM 11 is depicted in which a photoresist layer 18 is patterned above a bilayer made of an upper dielectric layer 17 and a lower metal layer 16. The bilayer is formed on a MTJ stack of layers consisting of a lower first magnetic layer 13, a middle tunnel barrier 14, and an upper second magnetic layer 15. In FIG. 3b, the photoresist pattern is transferred through the dielectric layer to form a dielectric layer pattern 17a. After the photoresist is removed, a second etch step (FIG. 3c) transfers the dielectric layer pattern through the lower metal layer to form a metal pattern 16a. Thereafter, in FIG. 3d, the pattern is transferred through the MTJ stack of layers to form a MTJ cell comprised of etched layers 13a-15a on a bottom electrode 12. In this process flow, the dielectric layer 17 acts as a sacrificial layer to prevent excessive etching of the Ta hard mask 16 during the final etch of the MTJ stack of layers. However, this approach usually employs chlorine based chemicals to achieve a high etch selectivity between the bilayer materials $SiO_2$ and Ta. Chlorine based chemicals can lead to device corrosion. Furthermore, the requirement for a sufficiently thick hard mask between the bit line and MTJ free layer is not met because the dielectric layer 17 is sacrificed and electrical shorting is still a possibility because of the thin lower metal layer 16. Therefore, a new MTJ hard mask design is needed to allow a thicker hard mask layer to avoid electrical shorting without compromising the photolithography process latitude required when printing sub-100 nm features.

Additional references were found during a routine search of the prior art. In U.S. Pat. No. 6,984,529, a patterned hard mask is oxidized to form an oxide surface before etching the underlying MTJ stack of layers to form a MTJ element.

In U.S. Pat. No. 7,252,774, a passivation layer such as Ta or TaN is patterned on a MTJ stack of layers followed by wet etching or RIE etching to remove at least the upper layer in the MTJ stack.

SUMMARY OF THE INVENTION

One objective of the present invention is to provide a MTJ hard mask design that employs a sufficiently thick hard mask to prevent shorting between an overlying bit line and underlying MTJ cell in a MRAM device.

A second objective of the present invention is to provide a MTJ hard mask configuration which enables a sufficiently thin photoresist layer to be patterned with sub-100 nm resolution and adequate manufacturing process latitude on the hard mask prior to transferring the pattern through the hard mask with an etch process.

A third objective of the present invention is to provide a method of etching the hard mask and underlying MTJ layers so that nanometer sized features in the photoresist layer according to the second objective are essentially reproduced to form a MTJ cell.

According to a first embodiment, these objectives are achieved by providing a substrate comprised of a bottom electrode layer on which a MRAM or spin torque MRAM structure is to be fabricated. A MTJ cell is formed by first depositing a stack of layers on the bottom electrode layer. In one aspect, the MTJ stack has a bottom spin valve configuration in which a seed layer, AFM layer, synthetic anti-ferromagnetic (SyAF) pinned layer, tunnel barrier layer, and a free layer are sequentially formed. A key feature is the formation of a composite hard mask comprised of a thin non-magnetic metallic layer on the free layer, a middle metallic spacer that serves as an etch stop, and an upper conductive layer that has high etch selectivity with respect to underlying MTJ layers. The thin non-magnetic metallic layer magnetically isolates the free layer from the middle metallic spacer to maximize the TMR effect and is also referred to as an isolation layer. The middle metallic spacer provides a height margin between the free layer and bit line to prevent electrical shorting after subsequent CMP planarization and bit line via (BLV) etching steps. The top conductive layer provides good electrical contact to the bit line and serves as an etch mask during transfer of the hard mask pattern through the MTJ stack of layers, and is sufficiently thin to enable sub-100 nm features in a thin photoresist layer formed on the top conductive layer to be transferred through the top conductive layer without consuming all of the photoresist layer.

In one aspect, the composite hard mask may be considered as a capping layer in the MTJ cell. All of the layers in the MTJ stack may be formed by sputtering or ion beam deposition (IBD). The MTJ stack of layers may be annealed at a temperature in the range of about 250° C. to 300° C. Once all the layers in the stack are laid down and thermally annealed to fix the pinned layer magnetization direction, a patterning and etching sequence is followed to fabricate the MTJ cell. First, a bottom anti-reflective coating (BARC) and a thin photoresist layer are sequentially coated on the composite hard mask. The photoresist layer is patterned to form arrays of features that define the hard axis and easy axis dimensions of the desired MTJ cells. Then the photoresist pattern is transferred through the BARC and upper conductive layer in the hard mask by a fluorocarbon etch that stops on the middle metallic spacer. Thus, exposed regions of the upper conductive layer have a substantially higher etch rate than the middle metallic spacer during the fluorocarbon etch. After the BARC and remaining photoresist layer are removed by an oxygen ashing step, the pattern in the upper conductive layer is transferred through the remainder of the composite hard mask and through the MTJ stack of layers by a second etching step involving one or more gases comprised of C, H, and O such as $CH_3OH$, $C_2H_5OH$, or $CO/NH_3$ that have a high selectivity to exposed regions of the underlying layers in the MTJ stack relative to the upper conductive layer. Next, the bottom electrode layer is etched to form a plurality of bottom electrodes so that there is a bottom electrode formed below each MTJ cell and the bottom electrodes are electrically isolated from each other. Thereafter, an insulation layer is typically deposited on the substrate and over the plurality of MTJ cells, and is thinned by a CMP process to be coplanar with the hard mask or at a level slightly above the hard mask. A RIE step may be employed to thin the insulation layer following the CMP process so that the top surface of the upper conductive layer is uncovered. A top conductor (bit line) may then be formed on the hard mask and insulation layer.

In a less preferred embodiment, the middle metallic spacer is omitted and the first etch step comprising a fluorocarbon gas stops on the lower non-magnetic layer. In this case, the lower non-magnetic layer is considerably thicker than in the first embodiment and provides a height margin between the MTJ free layer and subsequently formed bit line to prevent electrical shorting in the device. The other process steps are essentially the same as described in the first embodiment.

BRIEF DESCRIPTION OF THE DRAWINGS

FIGS. 1a-1d are cross-sectional views showing a prior art method of forming an MTJ cell in a MRAM device.

FIGS. 2a and 2b show top view and cross-sectional view, respectively, of a MTJ cell and surrounding insulation layer following a BIT line etch process, and FIG. 2c depicts shorting between a BIT line and MTJ cell because of insufficient height margin between the BIT line and free layer.

FIGS. 3a-3d are cross-sectional views depicting a second prior art method of using a hard mask to form a MTJ cell in a MRAM device.

FIG. 4a and FIGS. 4c-4f are cross-sectional views showing a sequence of steps for forming a MTJ cell in a memory device according to one embodiment of the present invention while FIG. 4b is a top-down view of the structure in FIG. 4a.

DETAILED DESCRIPTION OF THE INVENTION

Figure 4B:
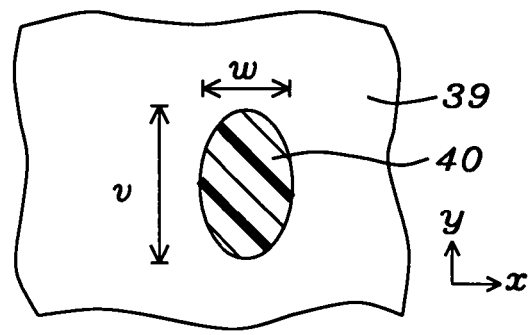

The present invention is a hard mask design and a method of using the hard mask to form MTJ cells having sub-100 nm resolution for advanced memory devices. The drawings are provided by way of example and are not intended to limit the scope of the invention. Further, the drawings are not necessarily drawn to scale and the relative sizes of various elements may differ from those in an actual device. Although a bottom spin valve MTJ structure is described in the exemplary embodiment, the present invention also encompasses other MTJ configurations such as top spin valve and multi-layer spin valve structures. A related MTJ etching process has been disclosed by the inventors in MagIC patent application HMG07-026 which describes the formation of easy axis and hard axis dimensions in a MTJ cell by employing separate photolithography steps and is herein incorporated by reference in its entirety.

A method of fabricating a MTJ cell by employing a composite hard mask structure according to a first embodiment of the present invention will now be described. Referring to FIG. 4a, a partially completed MRAM 30 is shown that has a via 32 formed within a first insulation layer 31 made of SiOx, SiN, SiON, $Al_2O_3$, or a low k dielectric material, for example. The via 32 is typically connected to an underlying transistor (not shown). There is a bottom electrode layer 33 formed on the via 32 and first insulation layer. The bottom electrode layer 33 may be a composite layer made of conductive materials as appreciated by those skilled in the art. An improved composition for a bottom electrode is described in related MagIC application HMG06-008/014 which is herein incorporated by reference in its entirety.

It should be understood that the MRAM 30 is part of an array in which multiple parallel word lines are formed in a first conductive layer (not shown) and multiple top conductor electrodes such as parallel bit lines are formed in a second conductive layer above an array of MTJs as described in a later section. In the exemplary embodiment, a MTJ cell will be formed between a bottom electrode and a bit line at each location where a bit line crosses over a word line.

A MTJ stack of layers is formed on the bottom conductor layer 33 and may be formed in the same process tool as the bottom conductor layer. For instance, the bottom conductor layer 33 and MTJ stack may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. The bottom conductor layer 33 and overlying MTJ layers may be formed after a single pump down of the sputter system to enhance throughput.

In a preferred embodiment, the MTJ stack of layers is fabricated on the bottom conductor layer 33 by sequentially forming a bottom portion 34 comprised of a lower seed layer, middle AFM layer, and upper pinned layer, a middle portion which is a tunnel barrier layer 35, and an upper portion which is a free layer 36. The bottom portion 34, tunnel barrier layer 35, and free layer 36 may be comprised of conventional materials. For example, the seed layer may be comprised of NiCr, NiFe, NiFeCr, or other suitable materials. The AFM layer is preferably made of MnPt although IrMn, NiMn, OsMn, RuMn, RhMn, PdMn, RuRhMn, or MnPtPd or the like are also acceptable AFM layer materials. In the exemplary embodiment, the AFM layer is magnetically aligned in the y-axis direction. An external magnetic field may be applied during the deposition of an MTJ layer such as an AFM layer or a ferromagnetic (FM) layer to influence a magnetization along a certain axis.

The pinned layer in the bottom portion 34 of the MTJ stack may be a synthetic antiferromagnetic (SyAF) layer having an AP2/coupling layer/AP1 configuration. Use of a SyAF pinned layer in the MTJ structure not only improves thermal stability but also reduces the interlayer coupling field (offset field) applied to the free layer. The AP2 layer is formed on the AFM layer and may be comprised of CoFe while the coupling layer is made of Ru, and the AP1 layer may be comprised of CoFe or CoFeB, for example. A slight difference in thickness between the AP2 and AP1 layers produces a small net magnetic moment for the SyAF pinned layer along the y-axis. Exchange coupling between the AP2 layer and the AP1 layer is facilitated by the coupling layer.

The tunnel barrier layer 35 is typically made of MgO, AlOx, or AlTiOx. The free layer 36 may be one or more of CoFeB, CoFe, and NiFe and is magnetically aligned along the y-axis (pinned layer direction). When the MTJ is elliptically shaped as seen in a top view (not shown), the easy axis of the MTJ element is preferably along the long axis (y-direction).

A key feature of the present invention is a composite hard mask comprising a lower non-magnetic metallic layer 37 formed on the free layer 36, a middle metallic spacer 38 that serves as an etch stop during a subsequent fluorocarbon etch, and an upper conductive layer 39 that has high etch selectivity with respect to the underlying MTJ layers. The composite hard mask may be employed instead of a conventional capping layer on the free layer 36. The non-magnetic metallic layer 37 magnetically isolates the free layer 36 from the middle metallic spacer 38 and is preferably made of Ru, Ti, Zr, Mg, or NiFeHf with a Hf content of about 15 to 25 atomic %. The thickness of the non-magnetic metallic layer 37 is about 20 to 50 Angstroms. In effect, the non-magnetic metallic layer 37 allows for independent tuning of the MTJ cell's magnetic property without interference from a middle metallic spacer 38 that could be an anti-ferromagnetic material and exchange couple with a NiFe free layer if no non-magnetic layer 37 was present. The presence of a nonmagnetic metallic layer 37 also allows the thickness of a middle metallic spacer 38 to be increased without affecting MTJ magnetic properties such as the TMR ratio.

The middle metallic spacer 38 is made of MnPt, Cu, Mg, Ru, Ti, Pd, Zr, or NiCr and has a thickness from 200 to 600 Angstroms. The middle metallic spacer 38 serves as an etch stop during a subsequent fluorocarbon etch that forms a pattern in the upper conductive layer 39 and preferably has a high etch rate in a subsequent etch step comprising C, H, O chemistry that transfers the pattern in the upper conductive layer through the underlying layers in the MTJ stack. In addition, the middle metallic spacer 38 provides a height margin during subsequent processing to ensure that the distance between the free layer 36 and an overlying bit line (deposited in a later step) is great enough to prevent electrical shorting in the final device. Preferably, the middle metallic spacer 38 is made of a different material than in the non-metallic metal layer 37.

The upper conductive layer 39 is preferably made of a Ta or TaN and has a thickness between 200 and 400 Angstroms. The upper conductive layer 39 is thin enough so that an overlying patterned photoresist layer 40 having a thickness of about 1000 to 3000 Angstroms will not be entirely consumed during a fluorocarbon etch process that transfers the photoresist pattern through the upper conductive layer 39 (FIG. 4c). In other words, the thickness of upper conductive layer is determined in part by the relative etch rate of upper conductive layer 39 to photoresist layer 40. However, the thickness of the upper conductive layer 39 must be large enough so that the upper conductive layer is not entirely consumed during an etch step that transfers the pattern 39a in FIG. 4c through the underlying MTJ layers to form a MTJ cell as described in a later section.

The present invention also encompasses one or more annealing steps after all of the MTJ layers have been deposited. For example, in the exemplary embodiment, the MTJ stack of layers including the composite hard mask may be annealed in a vacuum by applying a magnetic field of 10K Oe in magnitude along the y-axis (easy axis) for 1 to 5 hours at a temperature of about 250° C. to 360° C. An annealing step comprising a magnetic field applied along the hard axis may also be performed.

Returning to FIG. 4a, after all of the MTJ layers have been deposited and annealing is completed, a MTJ cell with sidewalls is fabricated by first coating a photoresist layer on the upper conductive layer 39 and patterning a plurality of photoresist features 40 that have a minimum dimension or width w of about 100 nm or less in order to meet the design rules of advanced memory devices such as spin torque MRAMs. Only one of the photoresist features is illustrated in order to simplify the drawing. Preferably, a very thin bottom anti-reflective layer or BARC (not shown) is formed on the upper conductive layer 39 prior to coating the photoresist layer in order to facilitate a larger process window for imaging the photoresist features 40. In some cases, the width w may be as large as 150 nm. However, the greatest advantage provided by the present invention is the capability to image photoresist features 40 with a sub-100 nm size for w and then to etch transfer the feature shape through the MTJ stack of layers to form a MTJ cell having a minimum dimension size of essentially w with an adequate manufacturing process latitude and no shorting between the MTJ cell and a subsequently deposited bit line. As indicated previously, the thickness of the photoresist layer is preferably in the range of 1000 to 3000 Angstroms, and more preferably in the range of 1000 to 2000 Angstroms in order to generate a minimum feature size w with good process latitude (exposure latitude and depth of focus) in photoresist features 40.

For example, the inventors have practiced a process wherein the MTJ stack of layers is comprised of a NiCr seed layer, a MnPt AFM layer, a CoFe/Ru/CoFe SyAF pinned layer, an AlOx tunnel barrier 35, a NiFe free layer 36, and a hard mask having a 30 Angstrom thick lower Ru layer 37, a 300 Angstrom thick middle metallic spacer 38 made of MnPt, and a 300 Angstrom thick Ta upper conductive layer 39. A 600 Angstrom thick BARC layer and a 2400 Angstrom thick photoresist layer were sequentially formed on the hard mask before patterning the photoresist 40 to form 80 nm features.

Figure 4C:
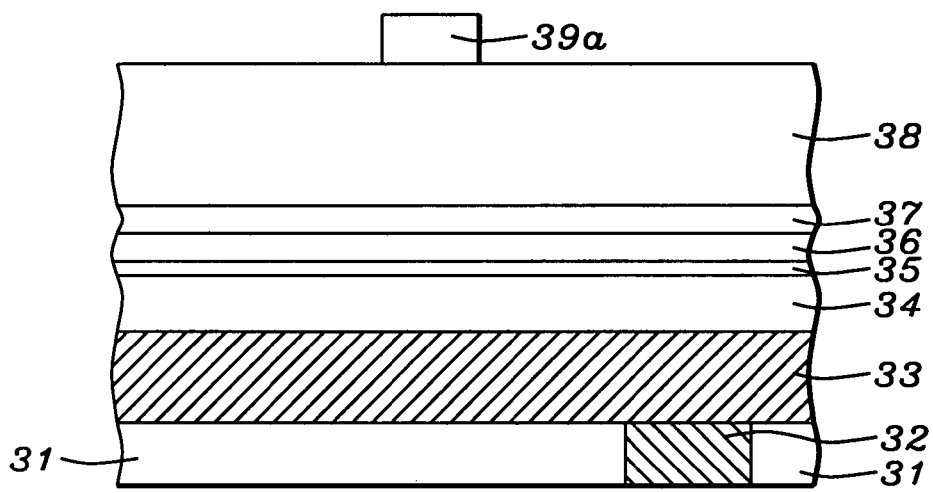

From a top-view in FIG. 4b, the photoresist feature 40 from FIG. 4a is shown with an elliptical shape although other shapes such as circular or eye shapes are also acceptable. The minimum dimension w is along the x-axis in the exemplary embodiment. Subsequently, the photoresist feature 40 shape will be transferred through the MTJ stack of layers to form a MTJ cell having an easy axis formed along the y-axis, for example, and a hard axis formed along the x-axis. Note that the lengthwise dimension v of the photoresist feature 40 may be up to 30 to 50 Angstroms greater than the length of w.

Referring to FIG. 4c, the photoresist feature 40 is employed as an etch mask during a first etching step that transfers the photoresist feature 40 shape through the upper conductive layer 39 to form a patterned conductive layer 39a that has essentially the same shape from a top-view (not shown) as illustrated for the photoresist feature 40 in FIG. 4b. The first etching step is preferably a RIE process comprised of a fluorocarbon gas such as $CF_4$, $C_2F_6$, $C_4F_8$, $CHF_3$, $CH_2F_2$, or the like. The first etching step may comprise a source RF power of 200 to 600 Watts, a bias RF power of 20 to 80 Watts, and a fluorocarbon flow rate of 30 to 80 standard cubic centimeters per minute (sccm) so that the photoresist feature 40 is not completely consumed before the feature shape is transferred through the entire upper conductive layer 39. For example, when $CF_4$ is employed as the etching gas, the first etching step preferably comprises a source RF power of 500 Watts and a bias RF power of 50 Watts. The first etching step stops on the middle metallic spacer 38 which has a substantially lower etch rate in the fluorocarbon gas than the upper conductive layer 39. Etch rates for various materials in the MTJ stack of layers during a first etching step comprised of $CF_4$ gas are shown in Table 1. The etch rate of CoFe is similar to that shown for NiFe. The tunnel barrier layer 35 is so thin (~10 Angstroms) that the etch rate does not have a significant effect on etch time or etch profile and thus the rate was not determined.

TABLE 1

Etching Rate of Selected MRAM Materials

| Material | MTJ layer | First etching step (nm/min) | Second etching step (nm/min.) |
|---|---|---|---|
| Ta | Upper conductive layer 39 | 85.0 | 3.7 |
| NiFe (CoFe) | Free layer 36, Pinned layer 34 | 2.0 | 49.0 |
| PtMn | Metallic spacer 38, AFM layer 34 | 3.3 | 41.0 |
| Ru | Metallic spacer 38 or non-magnetic layer 37 | 8.5 | 28.5 |
| Cu | Lower non-magnetic layer 37 | 4.0 | 55.0 |

From the data in Table 1, there is a high selectivity of at least 10:1 for Ta relative to a PtMn or Ru metallic spacer layer 38 during the first etching step as desired for the metallic spacer 38 to serve as an efficient etch stop.

Returning to FIG. 4c, the photoresist features 40 are stripped after the first etching step. Removal may be achieved by an oxygen ashing method in a RIE chamber by applying oxygen gas and a high power condition such as a source power of about 500 Watts and a bias power of about 300 Watts. The oxygen ashing step also removes the BARC layer (not shown) that is typically made of organic materials.

Figure 4D:
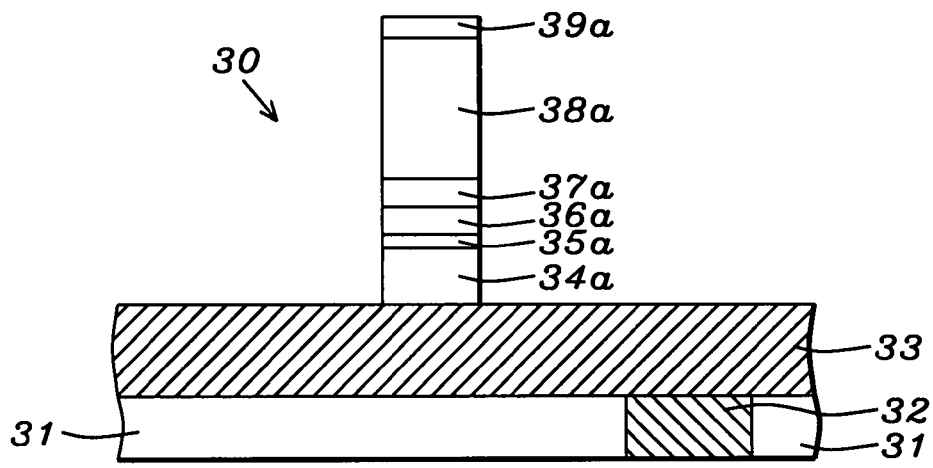

Referring to FIG. 4d, the conductive layer 39a shape is transferred through the underlying MTJ stack of layers including metallic spacer 38 and lower non-magnetic metallic layer 37 by a second RIE etching step that is preferably performed in a different etching chamber than was used for the first etching step and oxygen ashing. The etch rate for the conductive layer 39a should be substantially less than for exposed regions of the underlying MTJ layers so that the shape in conductive layer 39a is transferred through the remaining MTJ stack of layers before the conductive layer 39a is completely consumed. As indicated in the far right column of Table 1, other materials in the MTJ stack of layers etch from 8 to more than 10 times faster than a Ta conductive layer 39 when using a $CH_3OH$ etch chemistry. Preferably, the etch chemistry for the second etching step comprises one or more gases or gas combinations containing C, H, and O such as $CH_3OH$, $C_2H_5OH$, and $CO/NH_3$. Note that in the case of $CO/NH_3$, two gases are used to provide the C, H, and O etchant composition. In the example where $CH_3OH$ is used as the etching gas for the second etch step, the $CH_3OH$ flow rate is between 10 and 30 sccm with a source RF power of 800 to 1800 Watts and preferably 1500 Watts, and a bias RF power of 500 to 1500 Watts and preferably 1300 Watts for a period of 50 to 100 seconds. Note that the shape in conductive layer 39a is substantially reproduced in underlying MTJ layers to form a MTJ cell comprised of patterned layers 34a-39a.

Figure 5:
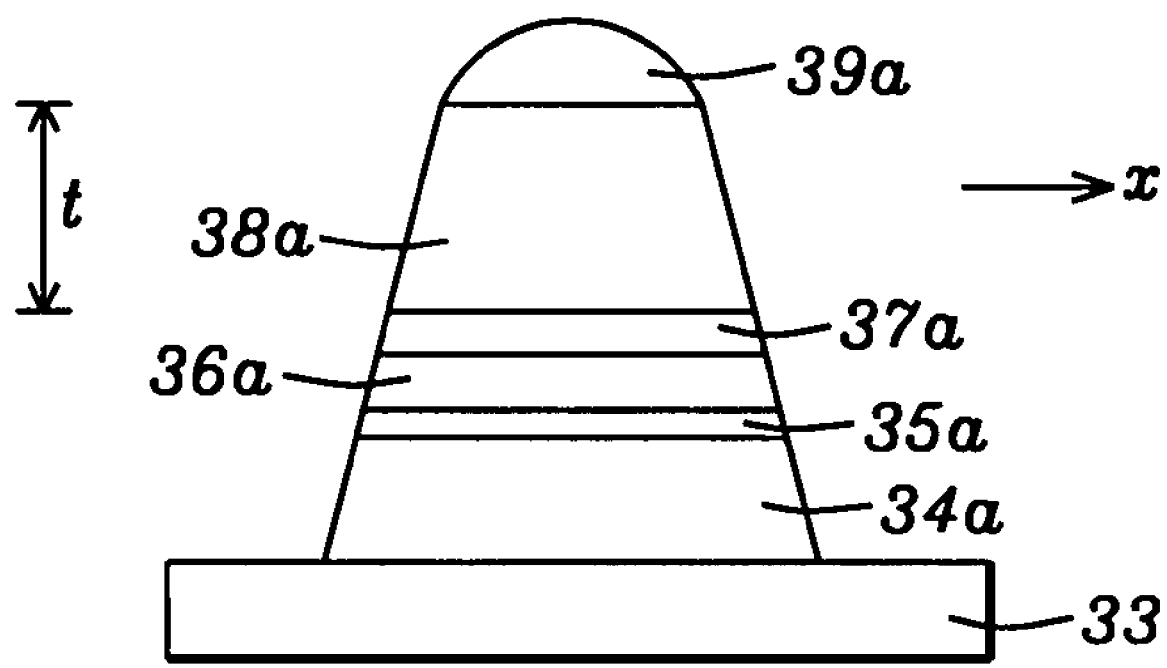
FIG. 5 is a cross-sectional view which is a replication of an actual TEM image showing a MTJ cross-section after the final etch step that defines the MTJ cell, and corresponds to the structure shown in FIG. 4c.

In one aspect, the second etching step may produce sloped sidewalls in the MTJ cell such that the bottom portion 34a has a greater width along the x-axis direction than the upper conductive layer 39a and middle metallic spacer 38a. FIG. 5 is a replication of an actual TEM image that shows a cross-section of the MTJ cell following the second etch step. The upper conductive layer 39a tends to become rounded due to the nature of the etching process. However, the thickness t of the metallic spacer 38a remains constant and provides an adequate height margin between the free layer 36a and a subsequently formed bit line (not shown) so that shorting in the final MRAM device can be avoided.

Figure 4E:
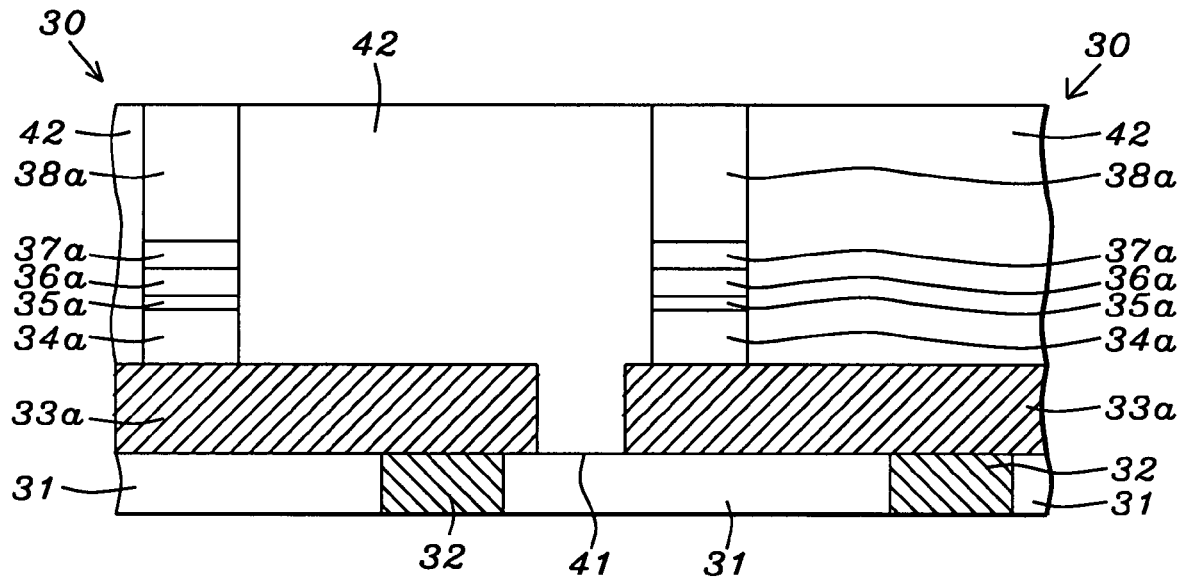

Referring to FIG. 4e, a first MRAM device 30 is shown adjacent to a second MRAM device 30 that has the same structure including a MTJ cell comprised of layers 34a-38a. Following the second etching step (FIG. 4d), a conformal dielectric layer (not shown) such as $SiO_2$ may be deposited on the MTJ cell to protect the MTJ cell during a subsequent etch process that forms bottom electrodes in the bottom electrode layer 33 as described in related patent application HMG06-008/014. In one embodiment, a photoresist layer (not shown) is coated and patterned on the conformal dielectric layer to form openings (not shown) that are subsequently etch transferred through the bottom electrode layer 33 and form a plurality of openings 41 which define a plurality of bottom electrodes 33a. There is one bottom electrode 33a electrically connected to each MTJ cell through a bottom portion 34a and there is a via 32 connecting each bottom electrode 33a to a transistor in a sub-structure that is not shown. Once the photoresist is removed, a second insulation layer 42 made of $SiO_2$, for example, is formed by a chemical vapor deposition or the like on the conformal dielectric layer above the bottom electrodes 33a to a thickness that fills openings 41 and the openings between MTJ cells. Thereafter, a CMP process also known as the MTJ CMP step is performed to planarize the second insulation layer 42. In one embodiment, the CMP process stops a certain distance above the upper conductive layer 39a and an etching step follows which removes an upper portion of the second insulation layer 42 and stops on the upper conductive layer 39a. The etching step may comprise $CF_4$ gas. In the exemplary embodiment, the etching step removes the remaining upper conductive layer 39a and stops on the metallic spacer 38a. An upper portion of the second insulation layer 42 may be etched adjacent to the sidewalls of the metallic spacer 38a because of an overetch condition. However, the metallic spacer 38a is sufficiently thick so that there is no danger of shorting between the free layer 36a and a subsequently deposited bit line.

Figure 4F:
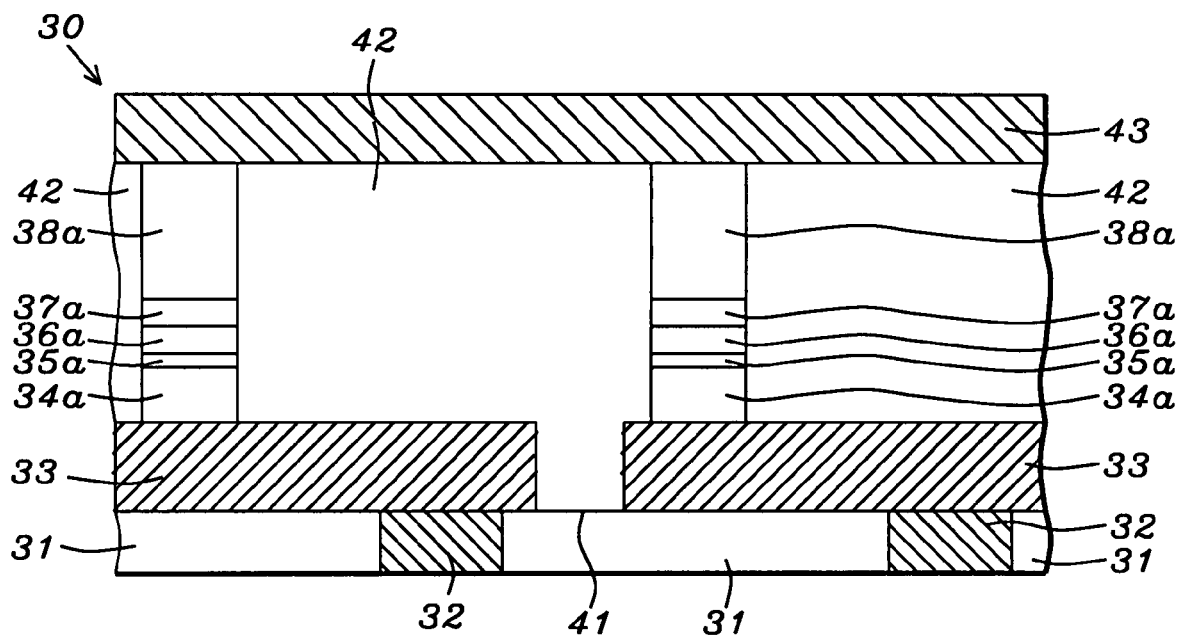

Referring to FIG. 4f, a third insulation layer (not shown) is deposited on the second insulation layer 42 and above the middle spacer 38a. A photoresist patterning and etching sequence is then used to form a pattern of trenches in the third insulation layer that define the location of bit lines to be deposited in a subsequent step. The trenches uncover the metallic spacer 38a in each of the plurality of MTJ cells. Note that each MTJ cell is formed above a bottom electrode 33a and a word line (not shown). Bit line via (BLV) openings (not shown) are also formed in the third insulation layer. Next, a seed layer (not shown) may be deposited in the trench pattern and in the bit line via openings according to a conventional technique. Thereafter, a plurality of bit lines 43 and bit line vias may be electroplated to fill the trench openings and bit line via openings, respectively. In the exemplary embodiment, a bit line 43 contacts a metallic spacer 38a in a MRAM device 30. Optionally, in an embodiment where the upper conductive layer 39a remains on the metallic spacer 38a following the MTJ CMP and second insulation layer etch step, a bit line 43 contacts an upper conductive layer 39a in MRAM 30.

In a second embodiment, the metallic spacer 38 is omitted from the composite hard mask. To compensate for the removal of the metallic spacer, the bottom non-magnetic layer 37 is intentionally made thicker than in the first embodiment to provide the height margin between the free layer and overlying bit line necessary to prevent electrical shorting in the final MRAM device. Moreover, the bottom non-magnetic layer 37 serves as an etch stop for the first etching step involving fluorocarbon gas and is preferably made of Cu, Mg, Ru, Ti, Pd, Zr, NiCr with a thickness from 200 to 600 Angstroms.

The present invention has successfully addressed an issue that to our knowledge has not been solved in the prior art. In particular, a hard mask design is disclosed for a MTJ cell fabrication that enables a thin photoresist pattern having sub-100 nm features to be efficiently transferred through a MTJ stack of layers while simultaneously providing a sufficiently large spacer between a free layer and overlying bit line to prevent electrical shorting in the resulting MRAM device. Furthermore, there is a larger process latitude during the MTJ CMP step and bit line via etching step because of the additional thickness margin allowed by the middle metallic spacer in the composite hard mask. Thus, higher MRAM device yield and a higher performing MRAM device are achieved.

While this invention has been particularly shown and described with reference to, the preferred embodiment thereof, it will be understood by those skilled in the art that various changes in form and details may be made without departing from the spirit and scope of this invention.

We claim:

1. A composite hard mask used for the fabrication of a MTJ cell in a MRAM device, comprising:
    (a) a lower non-magnetic metallic layer formed on a free layer in a MTJ stack of layers, said non-magnetic metallic layer essentially magnetically isolates said free layer from an overlying metallic spacer and has an etch rate substantially higher than an overlying upper conductive layer during an etch process comprised of one or more gases having a C, H, and O composition;
    (b) a middle metallic spacer that has an etch rate substantially lower than an overlying upper conductive layer during a fluorocarbon etch process that selectively removes portions of the upper conductive layer, and has an etch rate substantially higher than an overlying conductive layer during an etch process comprised of one or more gases having a C, H, and O composition; and
    (c) an upper conductive layer that has a substantial etch rate in regions exposed to a fluorocarbon etch but has a substantially high etch resistance to an etch process comprised of one or more gases having a C, H, and O composition.

2. The composite hard mask of claim 1 wherein the lower non-magnetic metallic layer is comprised of Ru, Ti, Zr, Mg, or NiFeHf and has a thickness of about 20 to 50 Angstroms.

3. The composite hard mask of claim 1 wherein the middle metallic spacer is comprised of MnPt, Cu, Mg, Ru, Ti, Pd, Zr, or NiCr and has a thickness from about 200 to 600 Angstroms.

4. The composite hard mask of claim 1 wherein the upper conductive layer is comprised of Ta or TaN and has a thickness between about 200 and 400 Angstroms.

5. A MTJ cell, comprising:
    (a) a seed layer formed on a substrate;
    (b) an anti-ferromagnetic (AFM) layer on the seed layer;
    (c) a pinned layer on the AFM layer;
    (d) a tunnel barrier layer formed on the pinned layer;
    (e) a free layer disposed on the tunnel barrier layer; and
    (f) a composite hard mask formed on the free layer, said composite hard mask is comprised of:
        (1) a lower non-magnetic metallic layer formed on the free layer, said lower non-magnetic metallic layer is comprised of Ru, Ti, Zr, Mg, or NiFeHf and magnetically isolates the free layer from an overlying metallic spacer;
        (2) a middle metallic spacer made of MnPt, Cu, Mg, Ru, Ti, Pd, Zr, or NiCr, said middle metallic spacer has a different composition than the lower non-magnetic metallic layer; and
        (3) an upper conductive layer comprised of Ta or TaN.

6. The MTJ cell of claim 5 wherein the lower non-magnetic metallic layer has a thickness from about 20 to 50 Angstroms.

7. The MTJ cell of claim 5 wherein the middle metallic spacer has a thickness of about 200 to 600 Angstroms.

8. A method of forming a MTJ cell in a memory device, comprising:
    (a) sequentially forming a MTJ stack of layers comprising a seed layer, AFM layer, pinned layer, tunnel barrier layer, and a free layer on a substrate;
    (b) forming a composite hard mask on the free layer, said composite hard mask is comprised of;
        (1) a lower non-magnetic metallic layer formed on said free layer, said non-magnetic metallic layer essentially magnetically isolates said free layer from an overlying metallic spacer and has an etch rate substantially higher than an overlying upper conductive layer in regions exposed to a subsequent etch process comprised of one or more gases having a C, H, and O composition;
        (2) a middle metallic spacer that has an etch rate substantially lower than an overlying upper conductive layer in regions exposed to a subsequent fluorocarbon etch process, and has an etch rate substantially higher than an overlying conductive layer in regions exposed to a subsequent etch process comprised of one or more gases having a C, H, and O composition; and
        (3) an upper conductive layer that has a substantial etch rate in regions exposed to a subsequent fluorocarbon etch, and has a substantially high etch resistance to an etch process comprised of one or more gases having a C, H, and O composition;
    (c) sequentially coating a bottom anti-reflective coating (BARC) and a photoresist layer on the upper conductive layer, and then patterning said photoresist layer to form a plurality of features having MTJ easy-axis and hard-axis dimensions;

(d) transferring said plurality of features through the upper conductive layer with a first etching step comprised of a fluorocarbon gas;

(e) removing said photoresist layer and BARC with an oxygen ashing step; and (f) transferring said plurality of features through the middle metallic spacer, lower non-magnetic metallic layer, and through the MTJ stack of layers with a second etching step comprised of one or more gases that provide a C, H, and O etchant composition.

9. The method of claim 8 wherein the lower non-magnetic metallic layer is comprised of Ru, Ti, Zr, Mg, or NiFeHf and has a thickness of about 20 to 50 Angstroms.

10. The method of claim 8 wherein the middle metallic spacer is comprised of MnPt, Cu, Mg, Ru, Ti, Pd, Zr, or NiCr and has a thickness from about 200 to 600 Angstroms.

11. The method of claim 8 wherein the upper conductive layer is comprised of Ta or TaN and has a thickness between about 200 and 400 Angstroms.

12. The method of claim 8 wherein the photoresist layer has a thickness between about 1000 and 3000 Angstroms to enable sub-100 nm features to be formed.

13. The method of claim 8 wherein fluorocarbon gas in the first etching step is comprised of $CF_4$, $C_2F_6$, $C_4F_8$, $CHF_3$, or $CH_2F_2$, a RF source power of about 200 to 600 Watts and a RF bias power of about 20 to 80 Watts.

14. The method of claim 8 wherein the second etching step is performed in a different process chamber than the first etching step or oxygen ashing step.

15. The method of claim 8 wherein the second etching step is comprised of $CH_3OH$, $C_2H_5OH$, and $CO/NH_3$, a RF source power of about 800 to 1800 Watts, and a RF bias power of about 500 to 1500 Watts.

16. The method of claim 8 wherein the exposed regions of the upper conductive layer etch at least 10 times faster than the middle metallic layer during the first etching step.

17. The method of claim 8 wherein exposed regions of the middle metallic layer, lower non-magnetic metallic layer, free layer, pinned layer, AFM layer, and seed layer etch at least 8 times faster than the upper conductive layer during the second etching step.

18. A composite hard mask used for the fabrication of a MTJ cell in a MRAM device, comprising:

(a) a lower non-magnetic metallic layer made of Cu, Mg, Ti, Pd, Zr, or NiCr formed on a free layer in a MTJ stack of layers, said non-magnetic metallic layer has an etch rate substantially lower than an overlying upper conductive layer during a fluorocarbon etch process that selectively removes portions of the upper conductive layer, and has an etch rate substantially higher than the overlying conductive layer during an etch process comprised of one or more gases having a C, H, and O composition; and (b) an upper conductive layer made of Ta or TaN that has a substantial etch rate in regions exposed to a fluorocarbon etch but has a substantially high etch resistance to an etch process comprised of one or more gases having a C, H, and O composition.

19. The composite hard mask of claim 18 wherein the lower non-magnetic metallic layer has a thickness from about 200 to 600 Angstroms.

20. The composite hard mask of claim 18 wherein the upper conductive layer has a thickness between about 200 and 400 Angstroms.

21. A MTJ cell, comprising:

(a) a seed layer formed on a substrate;

(b) an anti-ferromagnetic (AFM) layer on the seed layer;

(c) a pinned layer on the AFM layer;

(d) a tunnel barrier layer formed on the pinned layer;

(e) a free layer disposed on the tunnel barrier layer; and (f) a composite hard mask formed on the free layer, said composite hard mask is comprised of:

(1) a lower non-magnetic metallic layer formed on the free layer, said lower non-magnetic metallic layer is comprised of Cu, Ti, Zr, Mg, Pd, or NiCr; and (2) an upper conductive layer made of Ta or TaN.

* * * * *

UNITED STATES PATENT AND TRADEMARK OFFICE
CERTIFICATE OF CORRECTION

PATENT NO. : 7,696,551 B2  Page 1 of 1
APPLICATION NO. : 11/901999
DATED : April 13, 2010
INVENTOR(S) : Rongfu Xiao et al.

It is certified that error appears in the above-identified patent and that said Letters Patent is hereby corrected as shown below:

On the title page, item (75), delete third Inventor "Tom Zhang, Saratoga, CA (US)" and replace with -- Tom Zhong, Saratoga, CA (US) --.

On the title page, item (75), delete fifth Inventor "Adam Zhang, Milpitas, CA, (US)" and replace with -- Adam Zhong, Milpitas, CA (US) --.

Signed and Sealed this

Twenty-seventh Day of July, 2010

David J. Kappos
*Director of the United States Patent and Trademark Office*